United States Patent
Westersten

(10) Patent No.: US 7,656,153 B2
(45) Date of Patent: Feb. 2, 2010

(54) METAL DETECTOR WITH IMPROVED RECEIVER COIL

(76) Inventor: Allan Westersten, P.O. Box 50, Georgetown, CA (US) 95634-0050

( * ) Notice: Subject to any disclaimer, the term of this patent is extended or adjusted under 35 U.S.C. 154(b) by 145 days.

(21) Appl. No.: 11/338,486

(22) Filed: Jan. 23, 2006

(65) Prior Publication Data

US 2006/0164105 A1 Jul. 27, 2006

Related U.S. Application Data

(60) Provisional application No. 60/646,921, filed on Jan. 24, 2005.

(51) Int. Cl.
*G01N 27/72* (2006.01)
*G01V 3/02* (2006.01)
*G01V 3/10* (2006.01)

(52) U.S. Cl. .................... 324/239; 324/228

(58) Field of Classification Search .............. 324/228, 324/239–243, 256–258, 326–329, 67
See application file for complete search history.

(56) References Cited

U.S. PATENT DOCUMENTS

| 3,471,773 A | 10/1969 | Penland |
| 4,255,711 A | 3/1981 | Thompson |
| 4,659,896 A * | 4/1987 | Krasicki .................. 219/85.13 |
| 4,665,369 A * | 5/1987 | Faller et al. ................. 324/326 |
| 4,866,424 A | 9/1989 | Parks |
| 4,943,770 A * | 7/1990 | Ashley-Rollman et al. ..................... 324/207.17 |
| 5,227,719 A * | 7/1993 | Peterson et al. ............. 324/174 |

FOREIGN PATENT DOCUMENTS

WO WO 8701203 A1 * 2/1987

* cited by examiner

*Primary Examiner*—Bot L LeDynh

(57) ABSTRACT

A pulse-induction-type metal detector in which the receiver coil comprises bifilar windings that are connected in series, opposing during the coil pulse and in series, aiding, following the coil pulse. Pick-up of energy by the receiver coil during the coil pulse is thereby minimized and the duration of oscillations is curtailed. Owing to the rapid recovery of the system from the flux change that is used to charge the target, the signal sampling gate can be positioned very close to the trailing edge of the coil-current pulse, whereby detection of targets with very short time constants is made possible.

1 Claim, 3 Drawing Sheets

METAL DETECTOR WITH IMPROVED RECEIVER COIL

CROSS-REFERENCE TO RELATED APPLICATIONS

Provisional Application No. 60/646,921, filed on Jan. 24, 2005.

BACKGROUND OF THE INVENTION

This invention relates to metal detectors, and specifically to receiver coils used in pulse-induction-type metal detectors.

In such detectors, a primary magnetic flux pulse is directed into the medium to be searched, and a secondary flux is generated by eddy-currents in the target. The voltage induced by the secondary flux is sensed by a receiver coil.

The primary flux also induces a voltage in the receiver coil, and the target voltage cannot be effectively detected until the effects of the primary flux have substantially subsided.

The energy absorbed by the receiver coil is not dissipated immediately after the cessation of the coil pulse. The inductance and self-capacitance of the receiver coil constitute a resonant circuit that oscillates until the absorbed energy is dissipated. Usually a damping circuit is placed across the terminals of the coil to minimize the oscillations.

Even when a damping circuit is used, a minimum delay must be inserted between the end of the coil pulse and the beginning of the signal gating pulse, to avoid admixture of target and artifact signals.

The length of the delay determines the shortest time constant that a target signal can have to be detectable by the coil system. The target signal decays exponentially with time, and after a time interval that corresponds to about four time constants, it has been reduced to substantially zero.

This circumstance is of particular significance in metal detectors intended to detect high-resistivity metals. Tramp metal on conveyor belts frequently includes objects made of high-resistivity alloys. Gold veins and nuggets also represent targets with short time constants, owing to the relatively high resistivity of gold and the irregular eddy-current paths in such targets.

To mitigate the above difficulties, coil configurations that minimize the amount of intercepted energy have been devised. The "induction balance" type coil configuration is an example of such an arrangement. This amounts to a physical alignment of the coils in which the receiver coil intercepts essentially equal amounts of flux of opposing polarities from the transmitter coil.

The same effect can be obtained by adding a compensating coil with a tighter coupling to the receiver coil than the transmitter coil.

Penland, in U.S. Pat. No. 3,471,773 shows a coil configuration exemplifying the induction balance principle.

Thompson, in U.S. Pat. No. 4,255,711 shows the use of the compensating coil. Both of the above methods suffer from the drawback that the sensitivity of the detector is decreased by their use.

Furthermore, the balanced condition of the coil system is disturbed by the presence of magnetic minerals in the searched medium.

Parks, in U.S. Pat. No. 4,866,424 recognizes the problem created by energy absorption by the receiver coil, but does not solve the problem. Commercialized units of the detector described in the patent are being used at airports, and field tests have shown that knives made from titanal with 6-inch blades can be passed through the coil system without causing an alarm, even when the detector is used at its highest sensitivity

OBJECTS AND ADVANTAGES

It is an object of the present invention to provide a metal detector with a coil configuration that retains its maximal ability to capture target signals, while minimizing the absorption of energy from the primary flux. The advantage derived from the invention is that the delay between the coil pulse and the gating pulse can be minimized, enabling the detection or targets with very short time constants.

Detectors incorporating the improvement provided by the present invention are particularly useful in detecting weapons made from high-resisitivity alloys such as titanal and for detecting gold veins and nuggets.

DESCRIPTION OF THE PREFERRED EMBODIMENT

Figure 1:
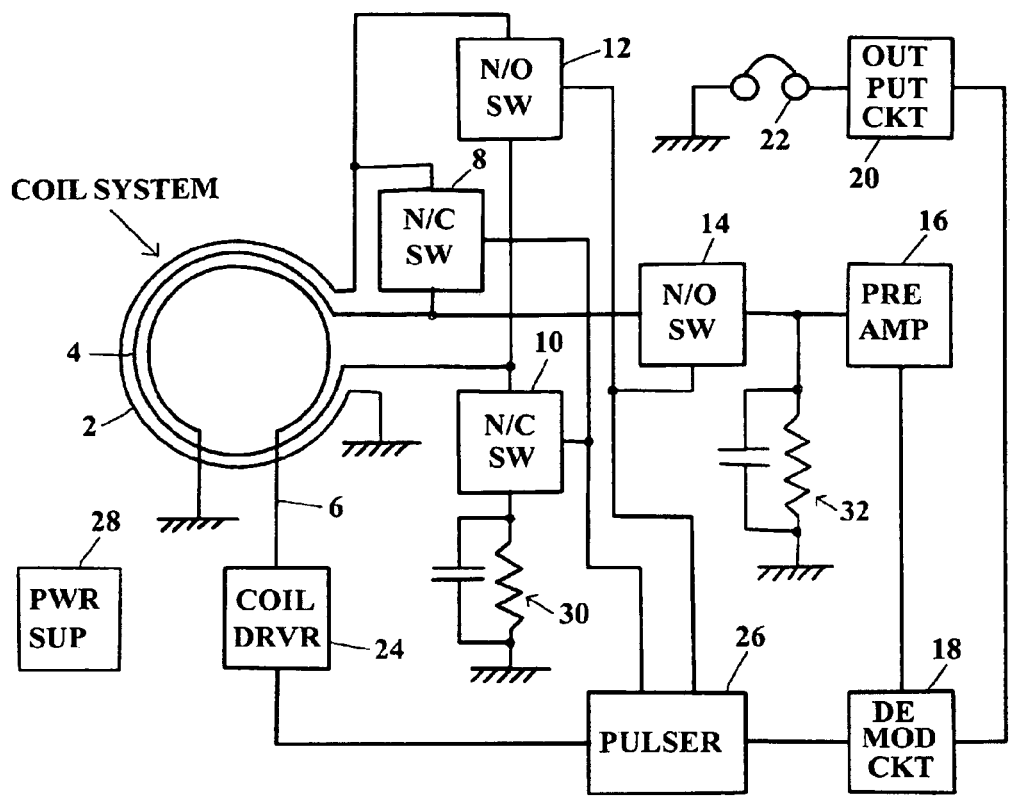
FIG. 1 shows a block diagram of the invention.

FIG. 1 shows a block diagram of the preferred embodiment of the invention.

The receiver coil consists of windings 2 and 4, which are wound in a bifilar arrangement. Windings 2 and 4 are also twisted around each other, to minimize coupling to adjacent windings. For maximal effect, the pitch of the twist should exceed two turns per inch.

Switches 8, 10, 12 and 14 are floating with respect to ground and have an on-resistance less than 100 ohms. They may be implemented with circuits shown in FIG. 2

Preamplifier 16, demodulator 18, and output circuit 20 may be implemented with conventional circuits, familiar to those skilled in the art.

Human interface device 22 generates an auditory signal to alert the operator, but it may also provide visual or tactile indicia.

Power supply 28 converts the voltage from the power line or a battery to voltages appropriate for the operation of the circuit. The design of the power supply is conventional, using switching technology.

Figure 2:
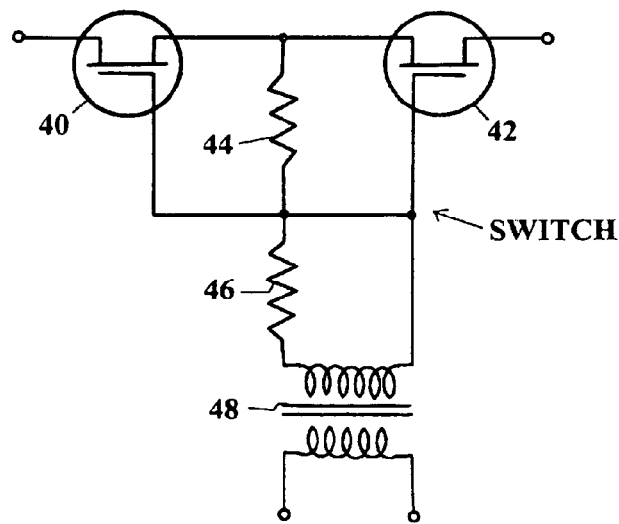
FIG. 2 shows switches 8, 10, 12, and 14 of FIG. 1 in greater detail.

FIG. 2 shows one of switches 8 to 14 in greater detail. FET transistors 40 and 42 are of the depletion type for the normally-on switches, and of the enhancement type for the normally-off switches. The transistors are connected back-to-back, so that in the off mode, signals are blocked, regardless of their polarity.

Pulse transformer 48 has a low inter-winding capacitance so that the switches are essentially floating with respect to ground and do not generate artifacts that affect the received signal. It is optimized to deliver pulses in the 10 to 100 microsecond range, which is the nominal width of the signal sampling pulse 64, in FIG. 3.

Resistors 44 and 46 are tailored to provide the transistors with pulse amplitudes that are above the turn-on threshold and below the maximally allowed amplitudes for the transistors.

DESCRIPTION OF THE OPERATION OF THE PREFERRED EMBODIMENT

In FIG. 1, coil windings 2 and 4 are normally short-circuited by switch 8, which is of the normally-closed type. Since windings 2 and 4 are bifilarly wound, the voltages induced in them are essentially equal.

The switches connect the two winding in series, opposing. Whatever imbalance may exist between the windings is going to appear as a voltage across switch 10. This is also a normally-closed switch, and therefore the voltage is imposed on network 30 which causes it to decay to essentially zero.

When the magnetic mineral content of the searched medium changes, the voltages induced in the bifilar windings remain equal and cancel, during the coil pulse.

Immediately after the coil pulse, switches 8 and 10 are opened, and switches 12 and 14 are closed.

This causes windings 2 and 4 to be connected in series, aiding, and any voltage intercepted by the receiver coil is channeled to preamplifier 16.

Figure 3:
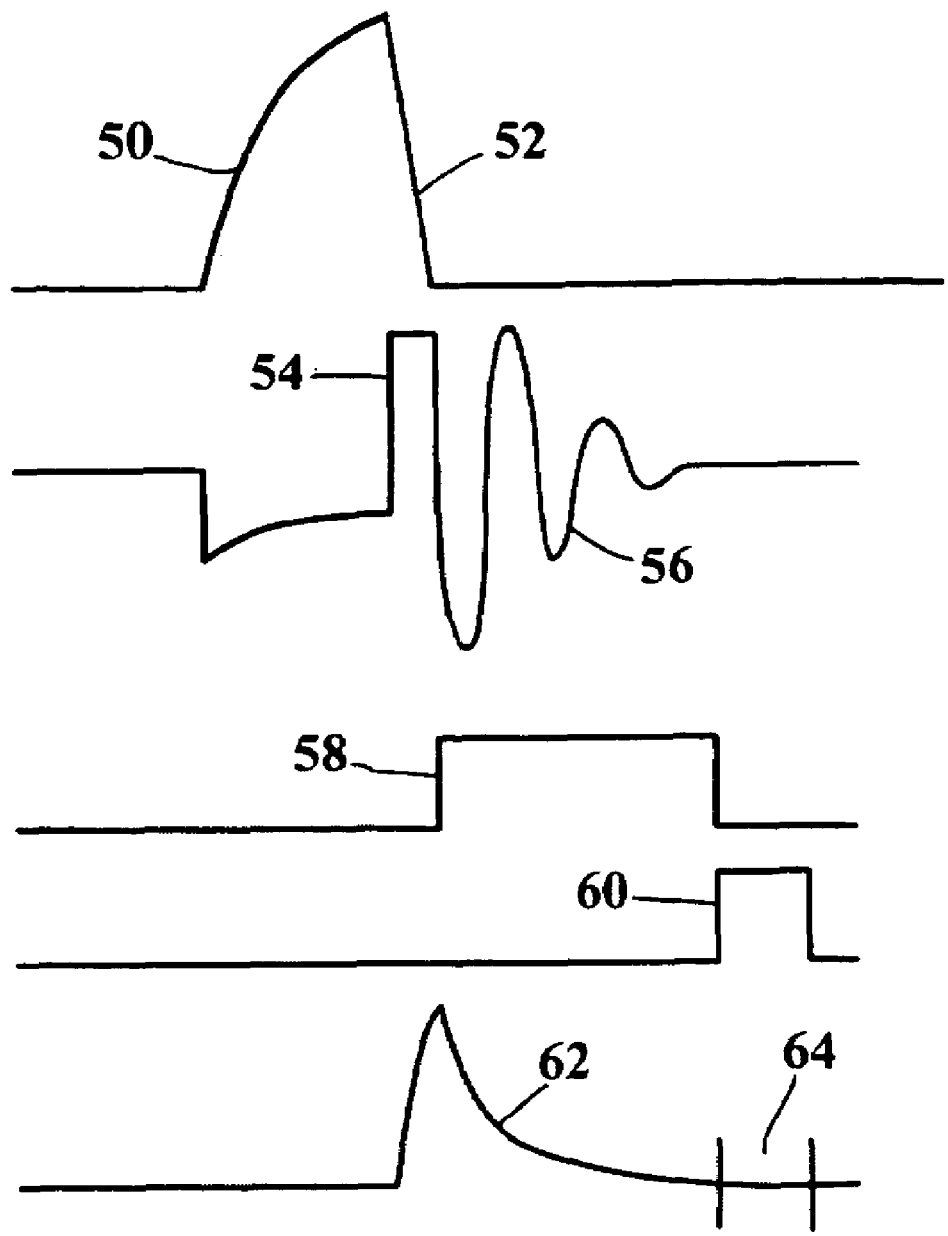
FIG. 3 shows the typical waveforms present during the operation of a detector of prior art.

FIG. 3 shows the coil current and the corresponding signals induced in the receiver coil, as they appear in a detector of prior art. Trace 50 shows the build-up of current in the transmitter coil, and trace 52 shows the rapid transition to zero, which causes the flux change that charges a potential target.

That flux change also induces a voltage transient 54 in the receiver coil, and the energy absorbed by the receiver coil owing to that transient, is dissipated by oscillations 56. A delay interval 58 must be interposed between the end of the coil pulse and signal gating pulse 60 to avoid admixing of the oscillatory signals and the eddy-current signal 62 from the target.

Owing to the delayed sampling pulse, a target signal 62, with a short time constant, has essentially decayed to zero by the time the signal is sampled.

Figure 4:
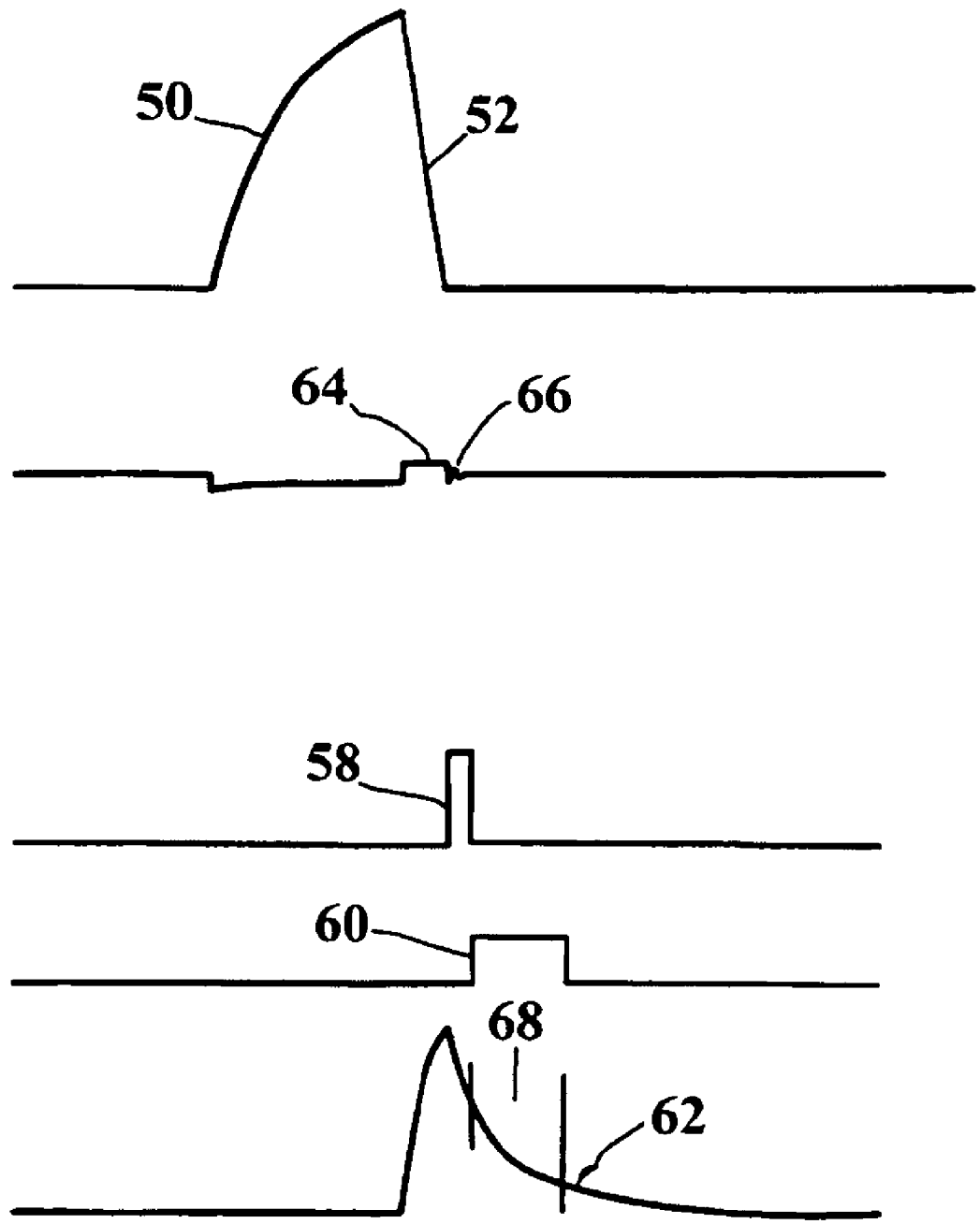
FIG. 4 shows the corresponding waveforms of the present invention.

FIG. 4 shows the improvement resulting from the use of the present invention. Trace 64 shows the signal intercepted by the coil when the two windings are connected in the cancelling mode. The amplitude of the voltage picked up has been reduced by more than a factor of 10 and the frequency of oscillation 66 has been increased by more than a factor of four. Although already substantially decreased in amplitude and duration, a higher oscillation frequency means that the residue is dissipated even faster.

As a result, delay 58 between the end of the coil current pulse and signal sampling gate 68 has been reduced to a small fraction of delay 58 in FIG. 3. Target signal 62 is now sampled at a time when it still has a measurable amplitude, thus enabling detection of targets with short time constants.

RAMIFICATIONS AND SCOPE OF THE INVENTION

The above embodiment is not to be construed as limitations as to the manner in which the invention can be implemented, but rather as examples of many possibilities. Likewise, the applications of the invention should not be considered to be limited to any one field.

Although circular coils are shown in FIG. 1, the principles described are equally applicable to coils of any shape, such as the rectangular ones used in walk-through metal detectors. Consequently, the scope of the invention should not be determined by the specifications but rather by the claims that follow.

I claim:

1. In a pulse-induction type metal detector, having a transmitter coil, a receiver coil, amplifying means, demodulation means and output means, the method, comprising the steps of:
   a) connecting bifilar windings of a receiver coil in series, opposing during the coil pulse, and
   b) connecting said bifilar windings in series, aiding, after the coil pulse,
      whereby the energy absorption of the receiver coil, during the coil pulse is minimized, allowing the positioning of the signal sampling pulse close to the trailing edge of the coil pulse, thus enabling the detection of targets with short time constants.

* * * * *